United States Patent [19]

Bogel et al.

[11] 3,987,316

[45] Oct. 19, 1976

[54] UNIVERSAL DIGITAL TIME DELAY RELAY HAVING A MULTISTATE INDICATOR AND DIGITALLY CONTROLLED CONTACTS

[75] Inventors: George F. Bogel, Pittsburgh; Leon J. Sienkiewicz, Export, both of Pa.

[73] Assignee: Westinghouse Electric Corporation, Pittsburgh, Pa.

[22] Filed: Aug. 29, 1974

[21] Appl. No.: 501,570

[52] U.S. Cl. ............................ 307/293; 307/215; 307/218; 307/252 B; 307/252 J; 307/247 R
[51] Int. Cl.² .................... H03K 5/13; H03K 17/60
[58] Field of Search ............ 307/252 B, 252 J, 254, 307/293, 215, 218, 247 R; 317/137, 148.5 B; 323/21, 22 SC

[56] References Cited
UNITED STATES PATENTS

| | | |
|---|---|---|
| 2,776,420 | 1/1957 | Woll ................................. 307/291 |
| 3,263,119 | 7/1966 | Scholl .............................. 315/200 A |
| 3,286,030 | 11/1966 | Puckett et al. ....................... 307/254 |
| 3,588,540 | 6/1971 | Bohn ................................. 307/293 |
| 3,656,005 | 4/1972 | Lee .................................. 307/252 B |
| 3,693,060 | 9/1972 | Joyce ................................ 307/278 |
| 3,740,587 | 6/1973 | Lee .................................. 307/252 B |

*Primary Examiner*—Stanley D. Miller, Jr.
*Attorney, Agent, or Firm*—M. J. Moran

[57] ABSTRACT

Solid-state digital time delay relay having a pair of complementary contacts one of which breaks or opens before the other of which makes or closes. The switching or transfer function utilizes logic elements for each set of contacts. A multistate indicator is also provided to give one indication of contact status.

2 Claims, 3 Drawing Figures

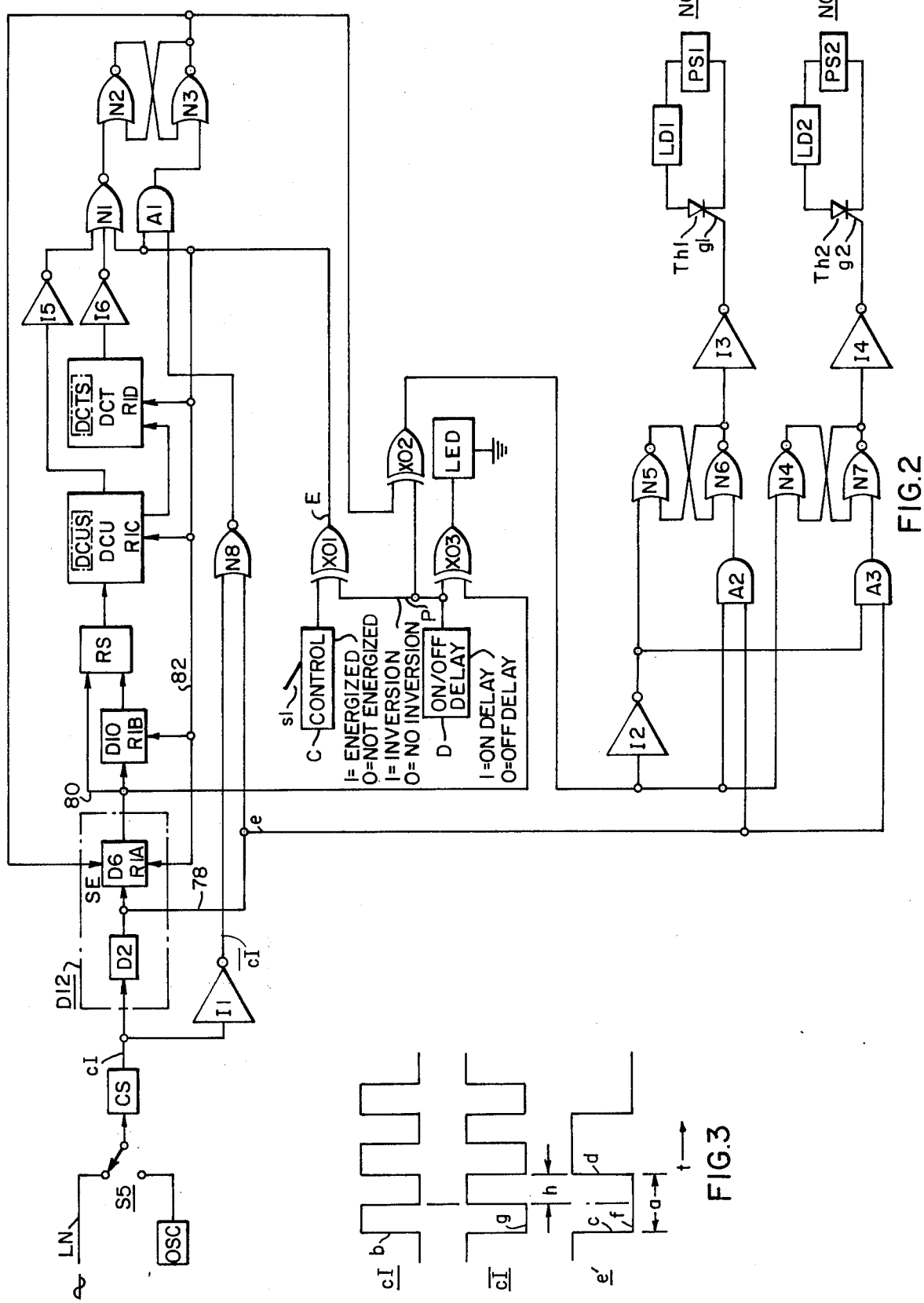

UNIVERSAL DIGITAL TIME DELAY RELAY HAVING A MULTISTATE INDICATOR AND DIGITALLY CONTROLLED CONTACTS

CROSS-REFERENCE TO RELATED APPLICATION

Certain inventions related to those disclosed in the present application are disclosed and claimed in copending application Ser. No. 501,430, filed concurrently by G. F. Bogel and assigned to the same assignee as the present application.

BACKGROUND OF THE INVENTION

The subject matter of this invention relates generally to solid-state digital timers and specifically to solid-state digital timers having break before make cooperation among the complementary contacts thereof and having multistate indicators.

It is known in the prior art to provide solid-state digital timers haaving complementary contacts. It is also known to provide solid-state digital timing means where a delay may be provided from the time the timing means is actuated until the time the contacts change states. It would be advantageous to provide a solid-state digital timer having complementary solid-state contacts which shift states or change states on a break before make basis, that is, the closed contacts will open before the opened contacts closes. It would also be advantageous to have an indication to the status of the contact state including an indication of a timing cycle.

SUMMARY OF THE INVENTION

In accordance with the invention a solid-state relay is taught having control means for actuating solid-state contacts to cause the contacts to change state. There are a pair of complementary solid-state contact means one of which is generally open and the other of which is generally closed. When the control means actuates the solid-state contact means to change state the one which is closed will open before the one which is opened will close. In the preferred embodiment this is accomplished by the utilization of logic functional elements, the control means will supply binary ones and binary zeros in accordance with this condition. The solid-state contact means which is to change state to an off condition will do so when a binary one is supplied to a logic element which is part thereof but the solid-state contact means which is to change state to an on condition will do so only in concurrence with the presence of two separate binary ones to two separate terminals of a second logic element. The application of one of the latter mentioned "ones" is delayed in relationship to the applilcation of the "one" to the first logic element. There is also provided a multistate illuminating means where the illuminating means is in a non-illuminating state when one of the solid-state contacts means is in a first state and the illuminating means is in an illuminating state when the solid-state contact means is in another state. If a time out operation is occurring, the illuminating means will flash to thus provide a third state.

BRIEF DESCRIPTION OF THE DRAWINGS

For a better understanding of the invention, reference may be had to the preferred embodiments exemplary of the invention shown in the accompanying drawings, in which:

FIG. 2 shows a solid-state digital timer utilizing a logic element break before make contact function; and FIG. 3 shows concurrent wave-shapes for actuating portions of FIG. 2.

DESCRIPTION OF THE PREFERRED EMBODIMENTS

Figure 1:
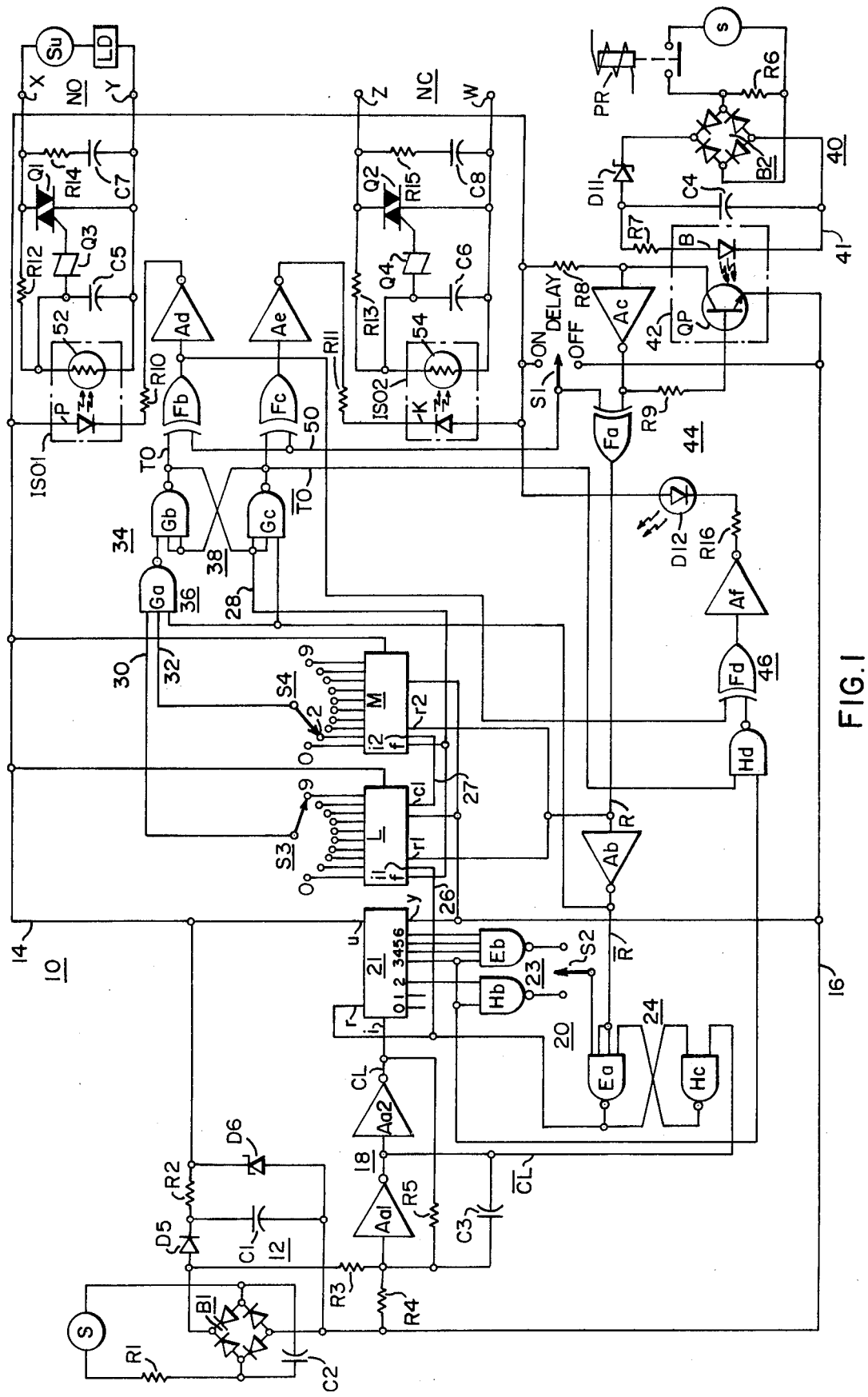
FIG. 1 shows a solid-state digital timer utilizing an electrochemical break before make function.

Referring now to the drawings, and FIG. 1 in particular, there is shown a digital time delay relay 10. The digital time relay comprises a source of electrical power S which provides in a preferred embodiment of the invention, sixty hertz alternating electrical current to a logic power supply element 12. Logic power supply element 12 provides in the preferred embodiment of the invention, 12 volt DC power between line 14 and line 16 for logic elements in a remaining portion of the digital time relay 10. Line 16 is a system common line or system return which is conveniently interconnected with various portions of the relay 10. System common line 16 is electrically connected to the logic supply 12. The logic supply 12 also supplies a signal to a clock shaper element 18. Preferably the latter signal is a 120 hertz full wave rectified signal. The shaper 18 provides a series of alternating digital zeros and ones which in the preferred embodiment of the invention, are 0 volts and 12 volts, respectively. There are two complementary output lines provided for the shaper 18. A signal CL is provided to a divider circuit 20. The other or complementary output signal $\overline{CL}$ is provided to another portion of the previously described divider circuit 20. The divider circuit 20 may comprise in a preferred embodiment of the invention, a seven stage binary counter 21 which is interconnected with a binary decoder 23 which in turn is interconnected with a binary latching circuit 24. There is also a switch S2 which is provided for determining the timing range of the digital time delay relay 10.

There is provided a reset which is utilized to carry a master reset signal R which signal is utilized by an inverter A$b$ to provide a complementary master reset signal $\overline{R}$. The complementary reset signal $\overline{R}$ is provided to the previously described divider 20 for resetting the divider 20. The output of the divider 20 is provided at line 26 and is utilized for indexing a programmable decade counter L. The programmable decade counter L records what is generally known as the least significant digit provided from the output of the binary counter 21. The decade counter L is interconnected with a similar decade counter M which is utiliized to count the most significant digit provided by the output of the binary counter 21. The output of the binary counter 21 consequently is utilized to index the decade counter L and the decade counter M through the decade counter L. The decade counters L and M are resettable through the master reset signal R. A disabled signal which is utilized to store a predetermined count on the decade counters L and M, is provided at a line 28. The output lines from the previously described decade counters L and M are generally designated 30 and 32 respectively. Both of the latter outputs are provided to an output logic circuit 34, the output logic circuit 34 has a decoder 36 interconnected with an output latch 38, an exclusive OR gate F$b$ and an exclusive OR gate F$c$. The exclusive OR gates F$b$ and F$c$ drive amplifiers or inverter circuits A$d$ and A$e$ respectively. The previously described output logic circuit 34 provides as one output signal thereof the previously described disable signal on line 28. The output from the inverter A*d* is provided to a non-overlapping isolator circuit IS01. The output from the previously described inverter A*e* is provided to a non-overlapping isolator circuit IS02. The non-overlapping isolator circuit IS01 is utilized to control the solid-state, normally opened relay NO whereas the non-overlapping isolator circuit IS02 is utilized to control the solid-state normally closed relay NC.

A source of power s is interconnected by way of a pilot relay or control relay PR to a rectifying circuit 40. Rectifying circuit 40 is interconnected by way of a dual function latching and isolating circuit 42 to a control logic circuit 44. The control logic circuit 44 is utilized in cooperation with a switch S1 to provide sufficient actuating information to the ON delay or an OFF delay function element for the previously described normally opened and normally closed contacts NO and NC respectively.

The output of the previously described circuit 44 provides the previously described master reset signal R. There is also provided a multiple state light blinking or flashing circuit 46 which is utilized to provide an indication of the status of the normally opened and normally closed contacts NO and NC respectively and the status of the timing operation during a timing cycle.

Digital Time Delay Relay Circuitry

The previously described source S is interconnected with a full wave diode bridge rectifier B1. Connectted in series with the input terminals of the previously described rectifier B1 is a noise suppressing and voltage dropping resistor R1; connected across the input terminals of the rectifier B1 is a noise suppressing capacitor C2. The bridge B1 is connected at one output terminal thereof to the anode of a diode D5, the cathode of which is connected to one side of a capacitor C1 and to one end of a resistive element R2. The other end of the resistive element R2 is connected to the regulating end of a Zener diode D6. The anode of the Zener diode D6 and the other side of the capacitive element C1 are connected to the other output terminal of the diode bridge B1. The latter output terminal also represents the previously described system common line or return line 16.

The clock shaper circuit 18 comprises a voltage divider of resistors R3 and R4 connected across the output terminals of the previously described diode bridge B1. Connected between the system common line 16 and the junction between the resistors R3 and R4, is the input of an inverter A*a*1. The output of the inverter A*a*1 is connected to the input of a second inverter A*a*2. The output of the second inverter A*a*2 is fed back to the input of the first inverter A*a*1 through resistive elements R5. Also connected to the output of the first inverter A*a*1 is the complementary clock output signal $\overline{CL}$. The output of the second inverter A*a*2 is connected to line CL which is known as the clock output line. Line CL is connected as an input to the terminal i of the seven stage binary counter circuit 21. The binary counter 21 may comprise a solid-state digital thin film integrated circuit module which has the capability of dividing by either 12 or 120 depending upon the setting of the switch S2. The $2^3$ output terminal through the $2^6$ output terminal of the seven stage binary counter 21 are connected as inputs to the previously described NAND gate E*b*. Likewise, the $2^3$ output terminal and the $2^2$ output terminal of the binary counter 21 are connected as inputs to the NAND gate H*b*. The respective outputs of the two NAND gates E*b* and H*b*, which comprise the decoder 23, are connected to the terminals of the switch S2, the wiper of which is connected to one input terminal of a NAND gate E*a*. The pole or wiper of the switch S2 may be alternately connected to the output of the NAND gate H*b* if a divide by 12 function is desirable or may be connected to the output of the NAND gate E*b* if a divide by 120 function is desirable. Connected as another input to the previously described NAND gate E*a* is the complementary master reset signal R. Also connected as an input to the NAND gate E*a* is the output from a complementary NAND gate. The output of the NAND gate E*a* is connected to an input of the previously described NAND gate H*c* and likewise the complementary clock signal CL is connected to another input of the NAND gate H*c*. NAND gates E*a* and H*c* cooperate to form the previously described latch 24. The output of a NAND gate E*a* is connected to line 26 which provides a positive going reset signal for the binary counter 21 at input terminal r thereof and an indexing signal for the decade counter L at an input terminal i1 thereof. An indexing signal from the decade counter L at terminal C1 is provided along line 27 to an indexing terminal i2 of the decade counter M.

Switches S3 and S4 are utilized to choose one of ten possible output terminals on each of the decade counters L and M. The output signals therefrom are provided respectively along the lines 30 and 32 to two of the three input terminals of a NAND gate G*a*. The third input to the NAND gate G*a* comes from the master complementary reset $\overline{R}$. The gate G*a* is part of the output logic element 34 and comprises a portion of the time out decoder 36. The output of the NAND gate G*a* is connected to one input terminal of a NAND gate G*b*, the other input terminal of the gate G*b* is interconnected with the output terminal of a similar NAND gate G*c*. The output of the gate G*b*, which is generally designated the time out terminal TO, is interconnected with an input terminal of the previously described gate G*c*. The two cooperating NAND gates G*b* and G*c* comprise the output latch 38. A disable signal on line 28 is interconnected with the time out terminal TO of the NAND gate G*b*. The output terminal of the NAND gate G*c* is known as the complementary time out terminal $\overline{TO}$. The master complementary reset signal $\overline{R}$ is also connected as one input of the NAND gate G*c*. The time out terminal TO of the NAND gate G*b* is connected to one input terminal to an exclusive OR gate F*b*. Another input terminal of the exclusive OR gate F*b* is connected by way of a line 50 to switch S1 which has two positions. The two positions are for programming ON delay or OFF delay. The complementary output terminal $\overline{TO}$ of the NAND gate G*c* is connected as one input to another exclusive OR gate F*c*. The other input terminal of exclusive OR gate F*c* is also connected with the line 50. The output of the exclusive OR gate F*b* is connected to the input of an amplifier A*d*. The output of the exclusive OR gate F*c* is connected to the input of an amplifier A*e*. The amplifier A*d* is interconnected by way of a resistor R10 to the cathode of a light emitting diode P the anode of which is connected to the positive power supply line 14. The light emitting diode P cooperates with a photoresistor 52 to form part of the nonoverlap isolating circuit IS01.

A terminal X for the normally open relay NO is connected to one side to a resistive element R14, to one end of a thyristor Q1 and to one end of a resistive element R12. The other end of resistive element R12 is connected to one side of the previously described photoresistor 52. Connected to the latter side of the photoresistor 52 is one side of a capacitive element C5 which is interconnected by way of a solid-state control element Q3 to the gate of the previously described thyristor Q1. The other side of the resistive element R14 is connected to one side of a capacitive element C7. The other side of the capacitive element C7, the other side of the thyristor Q1, the other side of the capacitive element C5 and the other side of the photosensitive resistor 52 are all interconnected to the Y terminal of a normally opened relay NO.

In a similar fashion, the output terminal of the inverter A$e$ is connected through a resistive element R11 to the cathode of a light emitting diode K the anode of which is connected to the positive supply line 14. The light emitting diode K cooperates with a photosensitive resistor 54 to form the non-overlapping isolator IS02. The Z terminal of the normally closed relay NC is connected to the one side of a resistive element R15, to one side of a thyristor element Q2 and to one side of a resistive element R13. The other side of the resistive element R13 is connected concurrently to one side of the previously described photoresistor 54, to one side of a capacitive element C6 and through a solid-state control element Q4 to the gate of the previously described thyristor Q2. The other side of the resistive element R15 is connected to one side of capacitive element C8. The other side of the capacitive element C8, the other side of the thyristor element Q2, the other side of the capacitive element C6 and the other side of the photoresistor 54 are connected to the common terminal W for the normally closed relay NC.

A power supply s is interconnected by way of a pilot relay PR to a resistor R6. Connected across the resistor R6 is the input of a diode bridge B2. The output of the diode bridge B2 is connected at one side thereof to the regulating terminal of the Zener diode D11 and at the other side thereof to a bridge common line 41. The other terminal of the Zener diode Z11 is connected concurrently to one side of a resistive element R7 and to one side of a capacitive element C4. The other side of the capacitive element C4 is connected to line 41. The other side of the resistive element R7 is connected to the anode of a light emitting diode B the other end of which is connected to line 41. The light emitting diode B cooperates with a phototransistor QP to form a combination latching and isolating circuit 42. The emitter of transistor QP is connected to the system common line 16. The base of the transistor QP is connected to one side of a resistive element R9. The collector of the phototransistor QP is connected to one side of a resistive element R8 and to the input of an inverter A$c$. The other side of the resistive element R8 is connected to the power supply line 14. The output of the inverter A$c$ is connected to the other side of the resistive element R9 for positive feedback for the phototransistor QD and is also connected to one input terminal of an exclusive OR gate F$a$. The other input terminal of the exclusive OR gate F$a$ is connected to the pole of the switch S1. The output of the exclusive OR gate F$a$ comprises the master reset terminal R. The master reset line or terminal R is connected to the input of an inverter A$b$ which provides at its output the complementary master reset signal $\overline{R}$.

A light blinker circuit 46 is provided which comprises a NAND gate H$d$ one terminal of which is connected to the previously described complementary output terminal $\overline{TO}$ of the output latch 38 of the output logic circuit 34. The other input terminal of the NAND gate H$d$ is connected to the $2^3$ output terminal of the previously described seven stage binary counter 21. The output terminal of the NAND gate H$d$ is connected to one input terminal of an exclusive OR gate F$d$. Another input terminal of the exclusive OR gate F$d$ is connected to the output terminal of the exclusive OR gate F$b$. The output terminal of the exclusive OR gate F$d$ is connected the the input terminal of an amplifier or inverter A$f$. The output terminal of the amplifier or inverter A$f$ is connected by way of a serially connected resistor R16 to the cathode of a light emitting diode D12, the other side of which is connected to the positive power supply line 14.

The switch S1 has the ON delay stationary terminal thereof connected to the positive power supply line 14 and the OFF delay stationary terminal thereof connected to the system common line 16. The pole of the switch S1 is movable between the latter two terminals.

Operation of the Digital Time Delay Relay

The source S in a preferred embodiment of the invention provides 60 hertz alternating current to the bridge B1. The resistive element R1 is utilized for voltage drop and noise suppression. Capacitive element C2 is also used as part of the noise suppression network. The capacitive element C1 cooperates with the resistive element R2 and the Zener diode D6 to provide a DC power supply voltage for the elements of the time delay circuit 10 between line 14 and 16. In a preferred embodiment of the invention the DC power supply voltage is 12 volts, positive. The diode D5 cooperates with the bridge B1 and the capacitive element C1 to clip the 120 hertz full wave rectified signal coming from the output terminals of the diode bridge B1. The voltage divider network comprising resistive elements R3 and R4 cooperates with the last named element to further reduce the voltage which is supplied to the inverter A$a$1. The output signal from the inverter A$a$1 is provided to another inverter A$a$2. The clock shaper 18 which comprises the inverters A$a$1 and A$a$2 performs a waveshaping function, that is it provides at the output terminals thereof proper pulses in terms of both waveshape and amplitude which may be utilized in the logic circuitry of the digital time delay relay 10.

Certain portions or elements of the digital time delay relay circuit 10 perform necessary functions which will be discussed at this time.

The inverters such as A$a$1, A$a$2, etc. invert the input signals provided thereto. As an example, if a binary one is placed on the input terminal thereof a binary zero will appear on the output terminal thereof. If a binary or digital zero is applied to the input terminal thereof, a binary or digital one will appear on the output terminal thereof.

The seven stage binary counter 21 has power supply terminals $u$ and $y$ for connecting to the positive and negative power supply lines 14 and 16 respectively. Counter 21 also has a reset terminal $r$ where reset of the counter 21 will occur on a positive going pulse, that is a pulse that changes from a binary zero to a binary one. Counter 21 has an input or indexing terminal $i$ where a signal is provided for causing the various binary output terminals to cooperate to give a count from zero to 127. There are seven different output terminals which are generally designated 0 to 6 and which represent $2^0$ on the left to $2^6$ on the right.

The decade counters L and M have power supply and reset terminals (not identified). The decade counters L and M also have an input of indexing terminal $i1$ and $i2$ respectively and carry out terminal $c1$ which provides a signal after each decade has been counted on the decade counter. There are also 10 decade output terminals ranging from 0 through 9 one of which is at a binary one and nine of which are at binary zeros at all times. There is a disabled or freeze terminal $f$ which when energized, will freeze or maintain the present or existing decimal output count even though signals continue to change at the input terminal $i1$ or $i2$ as the case may be of the counter.

There are NAND gates such as $Ga$, $Hb$ and $Ea$ etc. which have the characteristic of providing a digital one at the output terminal thereof if there is a digital zero on any input terminal thereof but providing a digital zero on the output terminal thereof only if there is a digital one on all input terminals thereof.

There are also the exclusive OR gates such as $Fb$, $Fc$, etc. which have the function of providing a digital zero output if all the input terminals thereof have the same digital signal thereon. That is, if there are two input terminals for the exclusive OR gate and both are at digital one or both are at digital zero the output of the exclusive OR gate is a digital zero. However, if one or the other input terminal is at digital one and the remaining terminal is at a digital zero, the output terminal will be at digital one. This gives the exclusive OR gate the characteristic of a programmable or controllable inverter. If one of the two input terminals is maintained at a digital zero then the signal on the other input terminal will be passed through the exclusive OR gate without inversion. However, if one of the input terminals is maintained at a digital one, the signal on the other terminal will pass through the exclusive OR gate with inversion.

Illustrative Example

In order to aid in describing the operation of the digital time delay relay 10, the description of the operation of the parts and elements thereof will be described in the context of an illustrative example. In the illustrative example, it is desired to provide an OFF time delay function for the normally opened contact NO, where the OFF delay is 29 seconds. To accomplish this switch S1 is placed in the OFF delay position which interconnects the wiper of switch 1 to the system common line 16 thereby placing a binary zero on the wiper of switch S1. The wiper of switch S2 is connected to the output terminal of the E$b$ NAND gate. Switch S3, which is the least significant digit switch is connected to the "9" output terminal of the decade counter L and switch S4 which is the most significant digit switch is connected to the "2" terminal of the decade counter M. In this example, the closing of the pilot relay PR should be thought of as providing a signal to close the normally opened contacts NO between the terminals X and Y. The subsequent opening of the pilot or contol contact or relay PR will cause an opening of the now closed but normally opened contacts NO, 29 seconds later.

Closing of switch PR interconnects the power supply s to the diode bridge B2. From the output terminals of the diode bridge B2 a full wave rectified signal which in a preferred embodiment of the invention is 180 volts peak is applied across the serial combination of the capacitive element C4 and the Zener diode D11. The junction terminal of the serially connected latter elements provides a regulated DC voltage thereat. This signal is applied to the series combination of the resistive element R7 and the light emitting diode B. The resistor R7 is a current limiting resistor. The current flowing through the diode B provides light which impinges upon the light sensitive base of the photosensitive transistor QP, thus driving the photosensitive transistor QP, into saturation causing a digital zero to be placed on the input terminal of the inverter A$c$ which in turn causes a digital one to be placed on the output terminal thereof. The digital one on the output terminal of the inverter A$c$ provides current through the resistive element R9 to the base lead of the transistor QP thus further driving the transistor QP into saturation for latching. Since a binary zero exists on the control terminal of the two terminal exclusive OR gate F$a$ a signal provided to the other terminal thereof will be fed therethrough without inversion. In this case, the previously described digital one on the output terminal of the inverter A$c$ is also present on the output terminal of the exclusive OR gate F$a$. The positive going leading edge of this signal which is also known as the master reset signal R resets the two previously described decade counters L and M at the reset terminals $r1$ and $r2$ thereof respectively. Consequently, the zero output terminals of the decade counters L and M are both at a digital one and the other nine terminals are all at a digital zero. Since the switches S3 and S4 are connected respectively to the "9" output terminal of the decade counter L and the "2" output terminal of the decade counter M, the first two input terminals for the time out decoder 36 NAND gate G$a$ are at binary zero. The output terminals of the exclusive OR gate F$a$ is also connected to the input terminal of the inverter A$b$. The output terminal of the inverter A$b$ therefore has impressed thereon that any instant of time the complementary master reset signal generally known as $\overline{R}$. This signal is provided concurrently to three NAND gates, namely NAND gate G$a$, NAND gate G$c$ and NAND gate E$a$. When the master reset signal R is at a binary one, the complementary reset signal $\overline{R}$ must be at a binary zero. Since a binary zero on any terminal of an NAND gate provides a binary one at the output terminal thereof it can be seen that the output terminal of the NAND gate G$c$ is at one and the output terminal of a NAND gate G$a$ is at one. The output terminal of the NAND gate G$c$ is fed back to one input terminal of the NAND gate G$b$. The output terminal of a NAND gate G$a$ is fed to the other terminal of the NAND gate G$c$. Consequently, two binary ones are present on the only two terminals of NAND gate G$b$ causing a binary zero to exist at the output terminal thereof. The output terminal of NAND gate G$b$ is fed back to the other input terminal of the NAND gate G$c$ placing another zero on its remaining input terminal thus latching or holding the output terminal thereof in the binary "1" state. The exclusive OR gate F$b$ has a binary zero on one control terminal thereof at line 50. Consequently, the binary zero on the other terminal thereof, that is, the output signal from the NAND gate G$b$ is passed through the exclusive OR gate F$b$ without inversion, and is provided to the input terminal of the inverter A$d$ which places a binary one on the output terminal thereof. This removes the sink for current from line 14 through the light emitting diode P and the current limiting resistor R10. Removing this current causes the photoelectrical or photochemical resistive element 52 to relatively slowly change its resistance from approximately 1K ohm to approximately 10 megohm in a preferred embodiment. Consequently, the voltage existing between the terminals X and Y cooperates with the resistive element R12 and the capacitive element C5 as well as the solid-state device Q3, to energize the gate of the thyristor or similar gated element Q1. This has the effect of closing the normally opened relay contacts NO and providing a current flow through the load LD and the source Su serially connected thereto. The resistive element R4 and capacitive element C7 are serially interconnected across the thyristor element for noise suppression purposes. Consequently, it can be seen that by closing the control relay PR the normally opened contacts NO are closed after a relatively short reset time.

The binary zero which was supplied to one terminal of the NAND gate Ea guarantees that a binary one is placed on the output terminal thereof. This binary one is fed back to the one input terminal of a NAND gate Hc. The clock bar signal $\overline{CL}$ from the output terminal of the inverter Aa1 is provided to the other input terminal of the NAND gate Hc, when it becomes a digital one which occurs 120 times every second, the output terminal thereof has a digital zero then placed thereacross which is fed back to an input terminal of the previously described NAND gate Ea, which generally guarantees that the latch combination 24 comprising the NAND gates Ea and Hc remain latched for the length of one clock pulse. The positive going pulse on the output terminal of the NAND gate Ea, as it changes from a binary zero to a binary one in concurrence with the closing of the switch PR, resets the seven stage binary counter 21 at the reset terminal r thereof. At this time the decade counters L and M are in the reset state which insures that there is a digital or binary one on the "0" decade terminal thereof. After reset has occurred, in the seven stage binary counter 21, the four input terminals connected to the decoder NAND gate Eb all go to zero, causing a one to be present at the output terminal of the NAND gate Eb. This digital one is provided to one of the input terminals of the NAND gate Ea through the switch S2. At a rate of 120 hertz the clock bar pulse $\overline{CL}$ provided to one of the input terminals of the NAND gate Hc goes to one thus setting up an opportunity for the output terminal of the NAND gate Ea to go to one. However, this will not happen as long as one zero is present on one input terminal thereof and that will be the case as long as the relay PR is closed.

As was described previously, when the relay PR Is opened, it is desired to open the now-closed contacts NO between the terminals X and Y after a 29 second delay. When the relay PR opens, the current through the diode B decreases consequently causing the transistor QP to turn off. This places a binary zero at the output terminal of the inverter Ac which provides a sink for current from the base of the transistor QP through the resistor R9 which therfore latches the transistor QP off. The binary zero is passed through the exclusive OR gate Fa and is inverted by the inverter Ab. Consequently, the complementary master reset signal $\overline{R}$ changes status from binary zero to binary one. This places a binary one on at least one input terminal each of the NANd gates Ea, Ga and Gc. Since some zeros exist on other input terminals of the NAND gates Ga and Gc no change occurs at the output terminals thereof. However, it is most likely that a binary one is also present on the output terminal of the decoder NAND gate Eb. This is because it is most likely that at least one of the input terminals thereof has a zero thereon. On the next occurrence of the presence of a zero on the clock bar $\overline{CL}$ input terminal of the NAND gate Hc, its output terminal will go to one and consequently a coincidence of ones on all of the input terminals of the NAND gate Ea will occur and the output terminal thereof will then go to zero. This will start the 29 second countdown for the subsequent opening of the solid-state relay contact NO between the terminals X and Y. This will not have an effect on the decade counters L and M, as it takes a positive pulse to effect these functions. However, as soon as one zero is present, on any one of the input terminals of the NAND gate Ea, it will change status at the output thereof from zero to one. This will occur when the output terminal of the NAND gate Eb goes to zero which will occur after one second when all its input terminals are at one or when a count of 120 is registered on the binary output. Once every second, the output terminal of the NAND gate Eb will go to one, thus causing reset of the binary counter 21 and indexing of the decade counters L and M if appropriate.

After 29 seconds, the decade counters L and M will be in such a state that all three of the inputs to the time out decoder NAND gate Ga will be digital ones thus causing the output of that NAND gate Ga to go to zero, thus causing the output of the sequentially connected NAND gate Gb to go to one, thus causing the exclusive OR gate output to go to one, thus causing the output of the amplifier Ad to go to zero, to thus start the current flowing in the light emitting diode P. This causes the resistance of the photoresistive control element 52 to rapidly change from approximately 10 megohms to approximately 1K ohm thus causing the thyristor element Q1 to cease to conduct, thus effectively opening the relay NO between the terminals X and Y.

While the above described operation occured with respect to the normally opened contacts NO, a similar and related operation was occurring with respect to the normally closed contacts NC. The original energization or depression of the relay PR caused a zero to be placed on the output terminal of the inverter Ae thus causing a large amount of currents to flow from the line 14 through the light emitting diode K and the current limiting resistor R11. This caused the photoresistive element 54 to relatively rapidly have a very low resistance, approximately 1000 ohms, to thereby cooperate with the resistive element R13, the capacitive element C6 and the control element or silicone bilateral switch Q4 to open the thyristor or triac Q2. Later when the normally opened relay was once again opened after the 29 second delay, the normally closed relay once again closed by action of the relatively slower increase resistance in the photoresistor 54. Thus, it is a property of the isolating and non-overlapping stages ISO1 and ISO2 to cause a break before making function for the two relays, NO and NC. Said in another way, when a situation arises where the relays NO and NC are each to change state theoretically generally simultaneously, that relay which is opening will always open a short period of time before the other relay closes.

The light emitting diode D12 is provided to give an indication of the status of the contacts NC and NO. In this embodiment of the invention, the light emitting diode will be illuminated or lit when the normally opened contact is closed (normally closed contact NC opened). Diode D12 will be dark or non-illuminating when the normally opened contact NO is opened (normally closed contact NC closed). The light emitting diode D12 will blink during time out whether it be a time delay to close or a time delay to open situation, and whether it be a divide by 12 or divide by 120 situation. In the latter case the flash frequency will vary between the divide by 12 and divide by 120 situation. Also the pattern of blinking, though hardly noticable will be complementary or inverted between the time out to open and the time out to close situation. The diode D12 will emit light when the output of inverter A$f$ goes low to provide a sink for current from line 14. The diode D12 will not emit light when the output of the inverter A$f$ goes high. The disposition of the output of the inverter A$f$ is directly affected by the status of the output of the exclusive OR gate F$d$. The status of the top input terminal of the exclusive OR gate Fd determines whether the exclusive OR gate Fd inverts the signal on the bottom terminal or not. The status of the bottom terminal is determined by the status of the output of the NAND gate Hd which in turn is dependent upon the status of its input terminals. The status of the output terminal of NAND gate Hd is either high, low or oscillating at a frequency dependent mainly upon whether a divide by 12 or a divide by 120 function is being utilized. In a divide by 12 situation the blinking frequency of the light emitting diode is generally 8 to 4, that is it will be in one state for 8 counts or until the 23 output "3" of the device 21 comes high and then will remain in another state until reset by the counter 21 at the occurence of the twelfth clock pulse CL. The proceeding operation will occur at 10 hertz rate. In a divide by 120 situation the blinking frequency of the light emitting diode is generally 8 to 8 with a timing mark occurring at the 120th pulse. This provides a 7.5 hertz rate with a timing indication every second.

Second Illustrative Example

By way of a second illustrative example, the cooperation among the elements in the digital time delay relay 10 will be further explained. Presume it is desirous to change the states of the normally opened contacts NO and the normally closed contacts NC such that there is an ON delay of 0.9 seconds for the normally opened contact NO. In this case, the switch S1 will be thrown from the OFF delay position to the ON delay position. Switch S3 will be maintained in the "9" position of the decade counter L and switch S4 will be placed in "0" position of the decade counter M. Switch S2 will be switched from the output of the E$b$ NAND gate to the output of the H$b$ NAND gate. The exclusive OR gates F$b$, F$c$ and F$a$ are thus converted from a non-inverting to an inverting state. The desired function in this case, is to have the normally opened relay close and the normally closed relay open 0.9 seconds after the control relay PR is closed. It is important to remember with respect to the digital time delay relay 10 that if the pilot control PR is open the mere energizing of the power supply circuit 12 automatically causes reset of all the appropriate devices, automatically causes the normally opened contact NO to open and automatically causes the normally closed contact NC to close. Consequently, no action is required with the relay PR initially as was the case with respect to the off delay case. Once the relay PR is closed, the output of the exclusive OR gate F$a$ goes low or goes to a digital zero, because the exclusive OR gate F$a$ is now in an inverting mode. Consequently, the complementary master reset signal $\overline{R}$ at the output of the amplifier A$b$ goes to a one. This places a one on one of the inputs of the NAND gate E$a$. It is also likely that the output of the NAND gate Hd is also at one because it is impossible for the two inputs provided thereto to be both at a one level at this time, counter 21 having been reset. On the occurrence of the complementary clock signal $\overline{CL}$ going to the zero state the NAND gate Hc will go to the one state at the output thereof, thus providing digital ones on all the inputs of the NAND gate E$a$ thus providing a digital zero on the output thereof. The input of the decoder NAND gate H$b$ is such that it will provide a zero on the output thereof once every 1/10 of a second, that is every 12 counts of the 120 hertz clock signal CL. The presence of the zero on the output of the NAND gate H$b$ will cause a subsequent reset of the counter 21 and an indexing of the decade counters L and M. When the decade counter L has been indexed to the ninth position, a digital one is provided at the wiper of the switch S3 which is fed to one input terminal of the NAND gate G$a$. Since the switch S4 is now connected to the zero terminal of the counter M, the input terminal of the gate G$a$ connected thereto is already at a binary one. Finally, the enabling or reset terminal of the gate G$a$, which is the only remaining input terminal therefor and which is connected to the output of the inverter A$b$ is also already at a binary one. Consequently, the output of the gate G$a$ will go to zero forcing the output of the gate G$b$ to go to one which thus interacts with the NAND gate G$c$ causing its output to go to zero. The exlcusive OR gate F$c$ will have its output go to one because it is now disposed in the inverting state. This causes the output of the inverter A$e$ to go to zero causing the current from the light emitting diode K to go high thus causing the resistance of the element 54 to go low. At the same time the output of the exclusive OR gate F$b$ will go to zero, causing the output of the inverted A$d$ to go to one, causing the resistance of element 52 to go high. This causes the thyristor Q1 to conduct in a manner that was described previously, thus closing normally opened contact NO. In this condition the light emitting diode 12 will be illuminated to indicate that the normally opened contact is now closed. In a like manner, the normally closed contact NC will be opened.

Referring now to FIG. 2, there is shown another embodiment of the invention in which the break before make concept described previously utilizes logic control elements rather than electrochemical elements. A clock shaper CS is provided which has its input connected to a switch S5 the wiper of which may be movable between line LN or an independent oscillator OSC. In this case the switch S5 is shown connected to the line LN. The output of the clock shaper CS may comprise a 120 hertz clock signal c1 which is in the form of serial pulses. This signal may be provided to an inverter I1 to provide a complementary clock signal $\overline{c1}$ at its output. The clock signal c1 is provided to a divide-by-12-counter D12. The counter D12 may comprise a divide-by-two-counter D2 connected in series with a divide-by-6-counter D6. In this embodiment of the invention the counter D6 has a separate "set" terminal SE and a separate "reset" terminal R1A. The output of the counter D2 may be provided to a separate line 78 for utilization in other portions of the circuit D12. The output of the counter D12 may be provided to a divide-by-10-counter D10 the output of which is provided to a range selector switch RS. Alternately, the output of the counter D12 may be provided directly to the range selector switch RS. The output of the counter D12 may also be provided to a separate line 80 for utilization in other portions of the circuit. The reset terminal R1A for the counter D12 is connected to a reset line 82. In the same manner the reset R1B for the counter D10 is also connected to the reset line 82. Depending upon the disposition of the range selector RS, the output of the counter D10 may be provided at the output of the range selector switch RS or the output of the counter D12 may be provided at the output of the range selector switch RS. The output signal of the counter D12 in the preferred embodiment of the invention is a 10 hertz signal while the output of the counter D10 in a preferred embodiment of the invention is a 1 hertz signal. The output of the range selector switch RS is provided to the input of a decade-counter-for-units DCU. The counter DCU may be preset to a given value from zero to nine at the preset control DCUS. The output 01 of the decade counter DCU is provided to a decade-counter-for-tens functional block DCT. The output 02 of Counter DCU is provided through an inverter I5 to one input of a NOR gate N1. A number may be preset at the preset control DCTS in the counter DCT. The output of the functional block DCT is provided through an inverter I6 to another input terminal of the previously described NOR gate N1. The decade counter DCU and the decade counter DCT also have present enable terminals R1C and R1D respectively which are both connected to the previously described reset line 82. The previously described complementary clock signal line $\overline{c1}$ and the previously described line 78 are both connected as inputs to a NOR gate N8. The output of the NOR gate N8 is provided as an input to an AND gate A1. There is also provided an exclusive OR gate XO1. The mode of operation of an exlcusive OR gate was described previously with respect to FIG. 1. The output of the exclusive OR gate XO1 is provided simultaneously to the reset line 82 and to the remaining terminal of the NOR gate N1 and the AND gate A1. The output of the NOR gate N1 is provided as one input to a NOR gate N2 the output of which is connected as one input to a NOR gate N3. The other input of the NOR gate N3 is connected to the output of the AND gate A1. The output of the NOR gate N3 is connected to the other input terminal of the NOR gate N2. The output of the NOR gate N3 is also connected to the set terminal SE of the previously described divider D12 and to one input terminal of an exclusive OR gate X02. Both the set terminal SE and reset terminal R1A of the counter D12 are connected internally to the counter D6 which is of course a portion of the counter D12. Consequently, the divide-by-2-counter D2 portion of the divide-by-12-counter D12 is not controlled by the reset line 82 nor the set terminal SE.

There is provided a control functional block C having a switch means s1 therein which is movable between an opened and closed position. In a preferred embodiment of the invention, the control C may be though of as the control which causes the normally closed and normally opened contacts NC and NO to operate. In a preferred embodiment of the invention the control C may be though of as providing an energizing signal when its output is a digital one and may be thought of as providing a non-energizing signal when its output is a digital zero. The switch s1 is utilized to control the difference in output signals for the control unit C. The output of the control unit C is provided to one terminal of the previously described exclusive OR gate X01. There is also provided an on/off delay selector D, the output of the on/off delay selector D is provided simultaneously to the remaining input terminal of the exclusive OR gate X01, to the remaining terminal of the exclusive OR gate X02 and to terminal of an exclusive OR gate X03. Each of these terminals are generally designated P indicating that they are programmable depending upon the disposition of the on/off delay control D. Generally an on delay signal from the control unit D will provide a digital one at the previously described P terminal and an off delay signal will provide a digital zero at the previously described terminal P. Connected to the remaining input terminal of the previously described exclusive OR gate X03 is the line 80. The output of the exclusive OR gate X03 is connected to a light indicating means or light emitting diode means LED. The output of the exclusive OR gate X02 is provided to the input terminal of an inverter I2, to one input terminal of an ANd gate A2, and to one input terminal of a NOR gate N4. The output of the inverter I2 is provided simultaneously to one terminal of a NOR gate N5 and to one input terminal of an AND gate A3. The remaining input terminal of each of the AND gates A2 and A3 is connected to the line 78. These terminals are generally designated e as is one of the input teerminals for the NOR gate N8. The output terminal of the AND gate A2 is connected to an input terminal of a NOR gate N6. The output terminal of the AND gate A3 is connected to the input terminal of a NOR gate N7. The output terminal of the NOR gate N5 is connected to the remaining input terminal of the NOR gate N6, and the output terminal of the NOR gate N6 is connected to the remaining input terminal of the NOR gate N5. In a like manner, the output terminal of the NOR gate N4 is connected to the remaining input terminal of the NOR gate N7 and the output terminal of the NOR gate N7 is connected to the remaining input terminal of the NOR gate N4. The output terminal of the NOR gate N6 is also connected to the input terminal of an inverter I3, the output of which controls the gate g1 of a thyristor $th1$. The anode circuit NC of the thyristor $th1$ is connected in series circuit relationship with a power supply PS1 and a load LD1. The output of the NOR gate N7 is connected to the input terminal of an inverter I4 the output of which is connected to the gate g2 of a thyristor th2. The anode circuit NO of the thyristor th2 is connected in series circuit relationship with a power supply means PS2 and a load means LD2. The circuit including the thyristor th1 generally must be opened if the circuit containing the thyristor th2 is closed and vice versa.

Operation

By way of an illustrative example, presume that it is desired to have an ON delay for the opening of the normally closed contact NC at a time 29 seconds after the closing of the switch s1 of the control unit C. The reset terminals generally designated R1A through R1D in the function block D12, the function block D10, the decade counter function block DCU and the decade counter function block DCT respectively cause a reset at zero time for the outputs of each of these units to a digital one. This means that a digital one must exist at the output terminal of the exclusive OR gate XO1 to cause reset. If the control switch S1 is opened as it should be in this operative example a digital zero is placed on the associated input terminal of the exclusive OR gate XO1. The ON delay will provide a digital one at the P terminal of the exclusive OR gate XO1. This will reset the previously described devices D12, D10, DCU and DCT as described. It will also place a digital one input on one terminal each of the NOR gate N1 and the AND gate A1. Unless all of the input terminals of the NOR gate N1 are zero, the output of the NOR gate N1 will be zero. The output of the decade counters DCU and DCT will be zero. The output of the decade counters DCU and DCT will be zero unless the preset values "2" and "9" respectively have been attained, and in which case the outputs of the decade counters DCU and DCT will both go to one, where they will be respectively inverted by the inverters I5 and I6 and made digital zero. Since the two mentioned decade counters DCU and DCT have recently been reset, the outputs of the inverters I5 and I6 will be one. Consequently, the output of the NOR gate N1 will be zero. As long as the output of the AND gate A1 is one, the output of the NOR gate N3 will be zero. As long as this is the case, both input terminals to the NOR gate N2 will be zero and its output terminals will be one and both input terminals to the NOR gate N3 will be one and its output will be zero. Such being the case, the associated input terminal of the exclusive OR gate XO2 is zero and its control terminal or P terminal is one. Thus the output terminal of the exclusive OR gate XO2 must be one. This provides a one to an associated input terminal of the AND gate A2 and a one to one of the input terminals of the NOR gate N4. This causes the output terminal of the NOR gate N4 to be zero which causes one of the input terminals of the NOR gate N7 to be zero. Since the output of the inverter I2 is zero, the associated input to the AND gate A3 is zero, and the output of the AND gate A3 must be zero. Consequently, the output of the NOR gate N7 must be one making the other input terminal of the NOR gate N4 one. When the synchronizing signal to the pulse train e terminal of the AND gate A2 is one the output of the AND gate A2 is also one thus causing the output of the NOR gate N6 to be zero consequently latching the NOR gates N5 and N6 in a manner similar to the way NOR gates N4 and N7 were latched. When this happens, the output of the inverter I3 will be one and the output of the inverter I4 will be zero. If the output of the inverter I4 is zero, the thyristor th2 will be in an off state or non-conducting. If the output of the inverter I3 is one, the gate gI of the thyristor th2 will be actuated causing the thyristor th1 to be turned on thus conducting current from the power supply PS1 through the load LD1.

When control switch s1 is closed, a one is placed on the other input of the exclusive OR gate XO1. This changes the output of the exclusive OR gate XO1 to a binary zero thus placing a binary zero on one terminal each of the NOR gate N1 and the AND gate A1 and on the reset line 82. If there is a zero on one terminal of the AND gate A1, there is a zero on the output terminal thereof, regardless of what happens at the other terminal of the AND gate A1. This places a binary zero on one of the input terminals of the NOR gate N3.

The train of pulses c1 propagates through the dividers D12 and/or D10 as the case may be, through the range selector switch RS and into the counters DCU and DCT until the preset time, in this case 29 seconds, has elapsed. After the elapsed time of 29 seconds, a digital one occurs at the respective output terminal of each of the decade counters DCU and DCT. The digital ones are changed to digital zeros by the inverters I5 and I6. Consequently, at this instant, all of the inputs to the NOR gate N1 are at binary or digital zero. This causes the output of the NOR gate N1 to go to one which causes the output of the NOR gate N2 to go to zero which thereby provides a zero on the other input terminal of the NOR gate N3. Since the NOR gate N3 now has zeros on all its input terminals, the output of NOR gate N3 goes to one placing a one on the other input terminal of the NOR gate N2. This latches the NOR gates N2 and N3.

The digital one on the output terminal of the NOR gate N3 is fed back to the counter D12 where the set input terminal SE thereof is energized to freeze or hold the count of the divide-by-6-portion D6 of the module D12.

The digital one on the input terminal of the exclusive OR gate XO2 is inverted because of the presence of another digital one on the P terminal of the exclusive OR gate XO2. Consequently, the output terminal of the exclusive OR gate XO2 is at a digital zero. Since this is the case, the output of the inverter I2 goes to a digital one which places a digital one on one of the input terminals of the NOR gate N5 and on one of the input terminals of the AND gate A3. The presence of the digital one on the previously described input terminal of the NOR gate N5 latches the NOR gates N5 and N6 into a disposition where a digital one is on the output terminal of the NOR gate N6 and a digital zero is on the output terminal of the NOR gate N5, and this is exclusive of the disposition of the pulse train or enable terminal e of the AND gate A2. The digital zero on the output terminal of the NOR gate N6 is converted to a digital one thus causing the output of the inverter I3 to go to a digital zero which in effect removes the gate drive from the thyristor th1 thus causing thyristor th1 to cease conducting which breaks the current conducting path between the power supply PS1 and the load LD1. This action occurs almost instantaneously with the occurrence of the digital one on the output terminal of the inverter I2. However, the digital one on the input terminal of the AND gate A3 will not pass through the AND gate A3 to change the status of the NOR gates N4 and N7 until the proper enable signal is present on the e terminal of the AND gate A3. This is true even though the zero from the output terminal of the exclusive OR gate XO2 has been quickly placed on one of the input terminals of the NOR gate N4.

By referring now to FIG. 3, it can be seen that the previously described presence of digital zeros on every input terminal of the NOR gate N1, which led to the removal of gate drive from the thyristor th1, almost instantaneously occurred when the clock pulse train cl changed state from a digital zero to a digital one. It is to be recalled that the latter action is necessary to index the elements D6, D10, RS, DCU and DCT. A positive going leading edge of the clock pulse cl is shown in FIG. 3 at b. In order for the digital one to pass through the AND gate A3 in FIG. 2, a digital one must also be present on the pulse train or enable terminal e thereof. This pulse train or enable terminal e is connected to the output of the divide by 2 portion D2 of the module D12 at the line 78. The waveshape for this latter signal relative to the previously described clock signal c1 is indicated by pulse train e' in FIG. 3. It can be seen that as the clock signal c1 goes positive, the e' signal goes negative or to a digital zero and remains at that state for one cycle of the clock pulse cl. It is to be recalled that the output of the module D12 is no longer oscillating because of the action of the set signal at the set terminal SE. However, the output of the divide-by-2-module D2 is not set and it continues to oscillate such as is indicated at graph e' in FIG. 3. The digital one necessary to allow the output of the AND gate A3 to go to a digital one will not occur relative to the occurrence of the rising leading edge b on the clock pulse c1 until a time "a" has passed as shown in FIG. 3, in which case the rise of the signal on line 78 will occur at d. Of course, once this happens, the latch comprising the NOR gates N4 and N7 will change state because AND gate A3 has been enabled by the one on line 78. Consequently, a digital zero is placed on the output of the NOR gate N7 which is converted to a digital one by the inverter I4 thus providing gate drive to the gate g2 of thyristor th2 which thus causes the thyristor th2 to turn on to conduct current and provide current flow through the power supply PS2 and the load LD2. The latter synchronized action between the solid-state contacts NC and NO provides a break before make function for the output terminals NC and NO respectively of the relay device shown in FIG. 2.

Referring once again to FIG. 2, when it is desired to turn the thyristor th2 off, and the thyristor th1 on once again, or said in another way, when it is desired to once again open the normally opened contact NO and close the normally closed contact NC the switch s1 is thrown the other way to deenergize the control C. This will immediately provide a digital one on the output terminal of the exclusive OR gate XO1 which will immediately reset all of the devices connected to line 82, namely divider D6, divider D10, the decade counter units module DCU, and the decade counter tens module DCT. At the same time, digital ones will be placed on one input terminal each of the NOR gate N1 and the AND gate A1. The placement of the digital one of the NOR gate N1 will immediately switch its output to zero, however, the latch comprising the NOR gates N2 and N3 will not switch states until the digital one provided to the previously described input terminal of the AND gate A1 is passed through the AND gate A1 by the occurrence of another digital one at the output terminal of the NOR gate N8. There will not be a digital one on the output terminal of the NOR gate N8 until the clock bar signal $\overline{c1}$ and the enable signal e on line 78 are both at zero. The coincident condition occurs when the clock bar pulse $\overline{c1}$ and the enable pulse e shown in FIG. 3 are at a disposition indicated by g and f. When this occurs, a zero immediately appears at the output terminal of the NOR gate N3 which causes the output terminal of the exclusive OR gate XO2 to go to one. This puts a digital one on one of the input terminals of the AND gate A2 and it also puts a digital one on one of the input terminals of the NOR gate N4. The presence of the digital one on the NOR gate N4 immediately causes the output terminal of the NOR gate N7 to change to a digital one without any other event occurring, other than the latching of the NOR gates N4 and N7. This then places a digital zero on the output of the inverter I4 which removes base drive current and voltage from the gate g2 of a thyristor th2 thus turning off the thyristor th2 at the next current zero of the power supply PS2 and consequently interrupting the current flowing in the load LD2. However, the disposition of the digital one on the previously described input terminal of the AND gate A2 will not be passed through the AND gate A2 until the signal on the pulse train e terminal of the AND gate A2 is also at a digital one.

By examining FIG. 3 once again, and referring to the curves generally designated c1 and e' it can be seen that the pulse train e terminal will not have a digital one signal thereon until incident d occurs, which is at least a time h after the thyristor Th2 is opened. Once the one appears on the pulse train e terminal of the AND gate A2, the latch comprising the NOR gates N5 and N6 will quickly change state to put a zero on the output terminal of NOR gate N6 and a one on the output terminal of the inverter I3. This turns on the thyristor th1 completing the circuit between the power supply PS1 and the load LD1. It can be seen from the latter discussion that the break before make between the normally opened contact NO and the normally closed contact NC occurs with respect to the opening of the switch s1 as well as with the closing of the switch s1.

The preceding illustrative example was directed to a case when there was a desired ON delay after a specific period of time after the switch s1 was thrown. It is to be understood with respect to the embodiments of this invention that OFF delay may also be accomplished in a similar manner utilizing the apparatus shown in FIG. 2. In essence, the functions described with respect to the last mentioned illustrative example will be the same however, the order will be transposed. Consequently, it is not necessary to describe a function by function operation for accomplishing OFF delay. However, as an example, presuming it is desired to have an OFF delay after a period of 45 seconds, the control element D would be disposed in the OFF delay mode, that is the output from the ON/OFF delay module D would be a binary zero. The switch sl on the control element C would be disposed in the energized position, that is, a digital one would be present at the output terminal of element C. When this occurs, the normally closed contact NC will be open and the normally opened contact NO will be closed. This would be accomplished with the synchronization and timing associated with the break before make function described previously with respect to the previously described operative illustrative example when the thyristor th1 was turned on and the thyristor th2 was turned off. The previously described synchronization between the presence of a change in output signal on the output terminal of the exclusive OR gate XO2 and the energization of the pulse enable terminals e of the AND gates A2 and A3 would also be accomplished as was previously described. When the switch sl was opened, the control unit C would have a digital zero at its output terminal and the previously described timing out function which ultimately leads to a change in status at the output terminal of the exclusive OR gate XO2 and the actions which follow would occur once again.

The various elements shown in FIG. 2 cooperate with the exclusive OR gate XO3 and the light emitting diode means LED to give a three state indication of the status of the normally opened and normally closed contacts NO and NC respectively. During a time out state, the light emitting diode LED flashes at a 10 hertz rate because of the 10 hertz signal that is provided to one input of the exclusive OR gate XO3 along line 80 from the output of the divider D12 during timeout. The illumination from the light emitting diode means LED may be 180° out of phase with the signal on line 80 depending upon the status of the P terminal of the exclusive or gate XO3. If a one is on the P terminal as in an ON delay situation, the light emitting diode will be 180° out of phase from its disposition during a situation when a zero is on the P terminal as in OFF delay. In a preferred embodiment of the invention the light emitting diode means LED may be dark before time out has begun, and may be illuminated after time out has been completed. In another embodiment of the invention, the light emitting diode means LED may be illuminated before time out begins and may be dark after time out has been completed. In the preferred embodiment of the invention the light emitting diodes means LED will be illuminated when a digital one exists on the output terminal of the exclusive OR gate XO3, and the light emitting diode means LED will not be illuminated when a digital zero is on the output terminal of the exclusive OR gate XO3.

It is to be understood with respect to the embodiments of this invention, that they may be adapted for use with integrated or discrete circuitry and with thick and/or thin film integrated circuit logic devices. It is also to be understood with respect to the embodiments of this invention that the frequencies of the various signals are not limiting but merely illustrative and that other frequencies may be utilized provided the synchronization between the input frequency and the other frequencies is maintained.

It is also to be understood that devices Q1 and Q2 and devices $th1$ and $th2$ may be triacs, thyristors or silicone controlled rectifiers or any other similar device which may be either isolated or non-isolated. It is also to be understood that the photoresistive elements provide the described break before make function by changing resistance more rapidly in one direction than in the other.

The apparatus embodying the teachings of this invention have several advantages. One advantage lies in the fact that the apparatus is capable of providing a break before make function for its output contacts or controls. Another advantage lies in the fact that it provides a multi-state indication of the status of the output contacts.

What we claim as our invention is:

1. A solid-state relay, comprising:
   a. control means for actuating solid-state contact means to change state;
   b. a pair of complementary solid-state contact means interconnected with said control means, one of which is generally opened and the other of which is generally closed, said control means actuating each of said solid-state contact means to change state after at least a predetermined time delay, in which case the contact means which is closed will always open before the contact which is opened will close; and
   c. multistate illuminating means interconnected with said control means and said pair of complementary solid-state contact means, said illuminating means being in a nonilluminating state when said contact means is in a first state, said illuminating means being in an illuminating state when said contact means is in a second state, and said illuminating means being in a flashing state during said period of predetermined time delay.

2. The combination as claimed in claim 1 wherein said illuminating means comprises a light emitting diode means.

* * * * *